United States Patent [19]

Weidemann

[11] 3,784,885

[45] Jan. 8, 1974

[54] SEMICONDUCTOR ASSEMBLY HAVING SEMICONDUCTOR HOUSING AND CONTACT DISCS DISPOSED WITHIN A TUBE

[75] Inventor: Erwin Weidemann, Erlangen, Germany

[73] Assignee: Siemens Aktiengesellschaft, Munchen, Germany

[22] Filed: Nov. 30, 1972

[21] Appl. No.: 310,876

[30] Foreign Application Priority Data

Dec. 3, 1971 Germany.................. P 21 60 001.1

[52] U.S. Cl....... 317/234 R, 317/234 P, 317/234 B, 165/80

[51] Int. Cl............................ H01l 3/00, H01l 5/00

[58] Field of Search......................... 317/234, 1, 1.5, 317/6; 174/15; 165/105, 80

[56] References Cited

UNITED STATES PATENTS

| | | | |
|---|---|---|---|
| 3,484,864 | 12/1969 | Bernstein et al. | 317/234 G |
| 3,499,095 | 3/1970 | Haus | 317/234 G |
| 3,502,956 | 3/1970 | Fries et al. | 317/234 B |
| 3,649,738 | 3/1972 | Andersson | 317/234 B |
| 3,703,668 | 11/1972 | Bylund et al. | 317/234 B |

FOREIGN PATENTS OR APPLICATIONS

| | | | |
|---|---|---|---|
| 1,076,237 | 7/1967 | Great Britain | 317/234 B |
| 1,489,690 | 5/1969 | Germany | 317/234 B |

*Primary Examiner*—John S. Heyman
*Assistant Examiner*—Andrew J. James
*Attorney*—Hugh A. Chapin

[57] ABSTRACT

A semiconductor arrangement is disclosed for use particularly with thyristors and in which the semiconductor bodies are arranged in disc-shaped housings having cooled electrical connecting elements. The housings and connecting elements are inserted into a tube, which may serve as a protective enclosure to establish a pressure connection and partially to conduct the coolant. By arranging flat contacts at the outside wall of the tube a plug-in component of compact design is obtained.

10 Claims, 6 Drawing Figures

SEMICONDUCTOR ASSEMBLY HAVING SEMICONDUCTOR HOUSING AND CONTACT DISCS DISPOSED WITHIN A TUBE

BACKGROUND OF THE INVENTION

1. Field of the Invention

This invention is concerned with a semiconductor device, and more particularly, with a thyristor assembly, in which each semiconductor is arranged in a disc-shaped housing between two contact discs, on which cooled electrical connecting elements rest under pressure.

2. Description of the Prior Art

Thyristors, constructed in a disc-type design are used in many cases to convert, control and switch electric energy. In one known thyristor converter, the thyristors are placed in disc-shaped housings and are arranged, to have cooling capsules with coolant input and output lines as well as electrical connections. The thyristors are then arranged in columnar fashion in series or in parallel and are clamped together by means of screws through pressure plates. This type of design results in complex line arrangements, and electrical wiring leading to large physical structures.

Rectifier devices with diodes are constructed in a similar manner. Here, too, difficulties are encountered regarding the arrangement of the coolant lines and the electrical connections.

SUMMARY OF THE INVENTION

It is therefore an object of this invention to design the electrical connections as well as the coolant lines in a manner which is as simple as possible, while reducing the size of the device.

To accomplish this objective in accordance with the invention, the problem is solved by providing a disc-shaped housing and an electrical connecting element inserted as a structural unit into a tube serving as a pressure connection so that the axis of the disc-shaped housing is located transversely to the axis of the tube. In this manner, the electrical and coolant circulation connections can be arranged in an easy-to-follow manner while a physically compact, closed design having reduced weight can be achieved. Further a protected assembly and a simple, vibration- and shockproof mounting of the components can be obtained.

BRIEF DESCRIPTION OF THE DRAWINGS

The invention will be explained more fully with reference to the drawings which illustrate examples of various embodiments constructed in accordance with the invention in which.

In the drawings the same number designates the same element.

DESCRIPTION OF THE PREFERRED EMODIMENT

Figure 1:
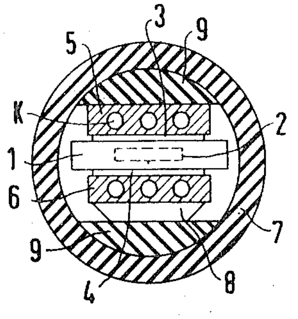
FIG. 1 illustrates a cross sectional view through a semiconductor device constructed in accordance with this invention.
Figure 2:
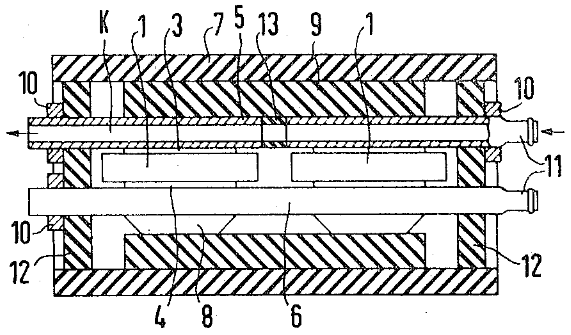
FIG. 2 illustrates the corresponding longitudinal cross sectional view through the semiconductor device of FIG. 1.

In the semiconductor device shown in FIGS. 1 and 2 a semiconductor body 2 in the form of a pellet is accommodated in each of the disc-shaped housings 1. The mutually insulated end faces 3 and 4 of the disc-shaped housing 1 consist of material having a high electrical conductivity and are designed as contact discs. On one side they make electrical contact with the two current-carrying electrodes of the semiconductor body 2, and on the outer end faces 3 and 4 they make electrical contact with electrical connecting elements 5 and 6. In accordance with the invention, the disc-shaped housing 1 and the electrical connecting elements 5 and 6 are inserted as a structural unit into a tube 7. Tube 7, which serves as a pressure connection consists of either a metal tube, insulated on the inside, or a fiberglass reinforced plastic tube. The housing 1 and electrical connecting elements 5 and 6 are inserted in such a manner that the axis of the disc-shaped housing 1 is located transversely to the axis of the tube. The necessary contact pressure is produced, for example, through the interposition of a cup spring 8. To match the curvature of the tube wall, adapters 9, constructed from a material or a surface having good sliding properties, are used in order to facilitate the insertion of the structural unit 1 into the tube 7.

As shown in FIG. 2, common, bar-shaped electrical connecting elements 5 and 6, serve the two separately controlled semiconductor bodies. These connecting elements have ducts, K, for passage of the coolant through the elements and are insulated from each other by an insulating section 13. The coolant is fed in at one end face and is discharged at the other end face of tube 7. The electrical connecting elements 5, which extend outwardly from the end faces of the tube, also have connecting members 10 for the electrical connection of the device and nozzles 11 for the coolant connection of the device. The end faces of the tube 7 can be closed off by insulating plates 12 as protection against accidental contact, foreign matter and water. A self-contained component having simple coolant circulation is thereby achieved.

Figure 3:
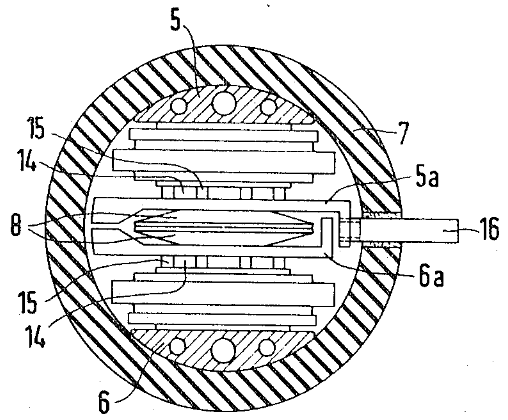
FIG. 3 illustrates a cross sectional view of a device constructed in accordance with this invention in which thyristors are arranged side by side and on top of each other.
Figure 4:
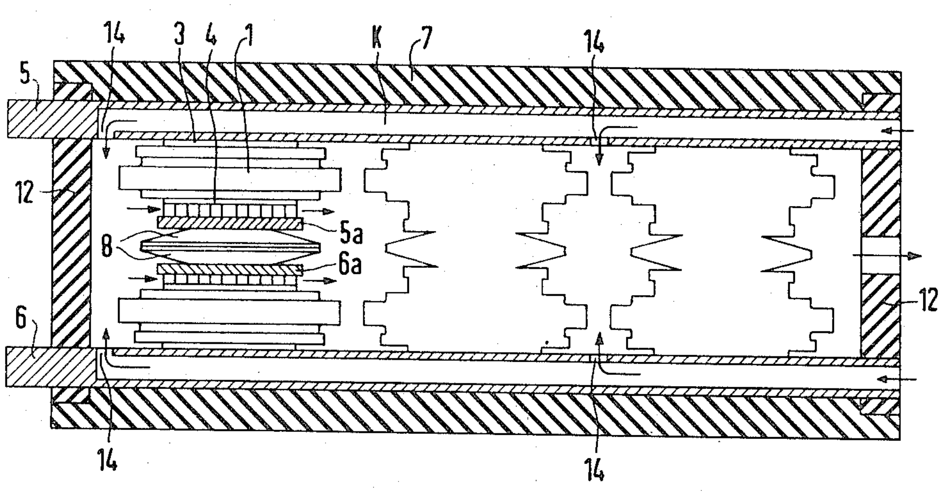
FIG. 4 illustrates the corresponding longitudinal cross sectional view through the thyristor device of FIG. 3.

In the embodiment of the invention shown in FIG. 3, a group of thyristors is combined to form a switching unit. Two disc-shaped housings 1, containing two thyristors each, having a cup spring 8, form a structural unit in the tube 7. A total of three structural units are arranged side by side. The coolant ducts K located in the outer bar-shaped electrical connecting elements 5 and 6 have exit openings 14 at predetermined spacings between each structural unit or each second structural unit. The cross section of the exit openings 14 is smaller than the cross section of the duct. The tube 7 here serves as the canal for the return of the coolant. Between the inner electrical connecting elements 5*a* and 6*a* and the disc-shaped housings 1, opening passages 14 are provided for the coolant. The returning coolant therefore flows around the inner connecting elements 5*a* and 6*a*.

It is advisable to form the passage openings 14 for the coolant by means of rectangular or cylindrical ribs 15 at the electrical connecting elements *5a* and *6a*. The tube 7 also has lateral openings to bring out the electrical connections transversely to the axis of the tube 7. In this manner, a further simplification of the coolant circulation can be achieved and an easy-to-follow arrangement of the electrical connections, even if a large number of thyristors or diodes are provided within one tube. If two thyristors are disposed on top of each other, the cup springs 8 advantageously are arranged in the middle between the two disc-shaped housings 1.

Figure 5:
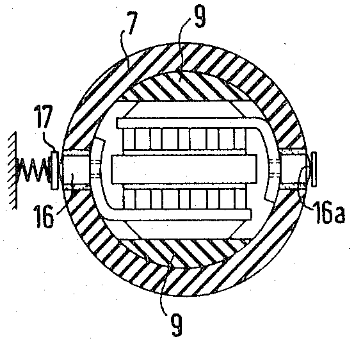
FIG. 5 illustrates a cross sectional view through another embodiment.
Figure 6:
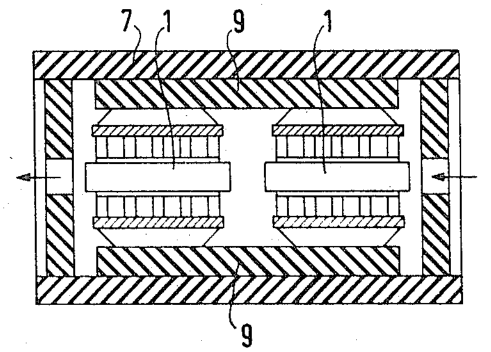
FIG. 6 illustrates the corresponding longitudinal cross sectional view of the device shown in FIG. 5.

In the embodiment shown in FIGS. 5 and 6, the one end face of the tube 7 is provided with a coolant inlet opening and the other end face with a coolant discharge opening. The coolant connections are not shown here in detail. The electrical connections are brought out transversely to the axis of the tube. The electrical connecting elements 5, *5a*, 6, and *6a* are preferably connected with the external electrical leads by a threaded post 16 or the like. The threaded posts 16 are screwed in through an opening after the structural units are placed in tube 7. The remaining space between the wall and the tube can be sealed in a simple manner by casting.

The threaded posts 16 advantageously are designed to cooperate with a pressure contact 17 and for this purpose are provided with a flat contact 16a. One thereby obtains a slide-in unit of small volume, protected against external influences, which can be installed in electrical equipment in a simple manner and can be replaced in case of a defect in a very short time.

In the foregoing, the invention has been described in reference to specific exemplary embodiment. It will be evident, however, that variations and modifications, as well as the substitution of equivalent constructions and arrangements for those shown for illustration, may be made without departing from the broader scope and spirit of the invention as set forth in the appended claims. The specification and drawings are accordingly to be regarded in an illustrative rather than in a restrictive sense.

What is claimed is:

1. A semi-conductor assembly, comprising:

a tube, a semiconductor body arranged within a disc-shaped housing, two contact discs having cooled electrical connecting elements under pressure, resting upon the semiconductor housing, and a cup spring, disposed between one of said contact discs and said tube, the semiconductor housing and said discs forming a unit and being insertable as a unit within the tube so that the axis of the disc-shaped housing is transverse to the axis of the tube.

2. A semiconductor assembly as in claim 1 wherein a plurality of semiconductors are used and the semiconductors are thyristors.

3. A semiconductor assembly in accordance with claim 1 in which the electrical connecting elements have a cooling duct within the element for supplying coolant to the unit within the tube.

4. A semiconductor assembly in accordance with claim 1 in which the tube is a duct for coolant and passages are provided in the electrical connecting elements to permit coolant flow between the electrical connecting elements and the disc-shaped housings.

5. A semiconductor assembly as in claim 3 wherein the passage openings are formed by ribs.

6. A semiconductor assembly as in claim 1 wherein the coolant ducts located within the electrical connecting elements have openings at predetermined points, the cross sectional area of each of said openings being smaller than the cross sectional area of the duct so that the tube serves as the canal for the return of coolant.

7. A semiconductor assembly as in claim 5 in which one end face of the tube is provided with a coolant input opening and the other end face has a coolant discharge opening.

8. A semiconductor assembly as in claim 6 in which the electrical connection between the assembly and the electrical supply circuit is formed by a connector transverse to the axis of the tube.

9. A semiconductor assembly as in claim 7 in which the electrical connectors are formed from a threaded post.

10. A semiconductor assembly as in claim 8 in which the threaded posts have a flat contact adapted to cooperate with a pressure contact.

* * * * *

UNITED STATES PATENT OFFICE
CERTIFICATE OF CORRECTION

Patent No. 3,784,885 Dated January 8, 1974

Inventor(s) Erwin Weidemann

It is certified that error appears in the above-identified patent and that said Letters Patent are hereby corrected as shown below:

In column 2, line 6, change "EMODIMENT" to --EMBODIMENT--

In column 2, line 53, change "unit in the tube 7" to --unit in tube 7--

In column 3, line 32, change "examplary embodiment" to --exemplary embodiments--

In column 4, line 25 (claim 6), change "as in claim 1" to --as in claim 2--

Signed and sealed this 9th day of July 1974.

(SEAL)
Attest:

McCOY M. GIBSON, JR.
Attesting Officer

C. MARSHALL DANN
Commissioner of Patents